United States Patent
Park et al.

(10) Patent No.: US 8,004,898 B2
(45) Date of Patent: Aug. 23, 2011

(54) NONVOLATILE MEMORY DEVICE, PROGRAM METHOD THEREOF, AND MEMORY SYSTEM INCLUDING THE SAME

(75) Inventors: Ki-Tae Park, Seongnam-si (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 12/320,092

(22) Filed: Jan. 16, 2009

(65) Prior Publication Data
US 2009/0180323 A1    Jul. 16, 2009

(30) Foreign Application Priority Data
Jan. 16, 2008  (KR) .................. 10-2008-0004957

(51) Int. Cl.
*G11C 16/06*    (2006.01)
(52) U.S. Cl. ......... 365/185.12; 365/185.18; 365/185.19; 365/185.03; 365/185.22

(58) Field of Classification Search ............. 365/185.12, 365/185.18, 185.03, 185.22, 185.19
See application file for complete search history.

(56) References Cited

U.S. PATENT DOCUMENTS

| | | | | |
|---|---|---|---|---|
| 5,930,169 | A  * | 7/1999 | Iwata et al. | 365/185.09 |
| 7,177,199 | B2 | 2/2007 | Chen et al. | |
| 7,630,246 | B2 * | 12/2009 | Roohparvar | 365/185.18 |
| 7,848,158 | B2 * | 12/2010 | Moschiano et al. | 365/189.11 |
| 2006/0104120 | A1 * | 5/2006 | Hemink | 365/185.28 |
| 2006/0171210 | A1 | 8/2006 | Nagashima et al. | |

FOREIGN PATENT DOCUMENTS

| KR | 10-2005-0015889 A | 2/2005 |
|---|---|---|
| KR | 10-2006-0086362 A | 7/2006 |
| KR | 10-2006-0107689 A | 10/2006 |

* cited by examiner

*Primary Examiner* — Connie C Yoha
(74) *Attorney, Agent, or Firm* — Lee & Morse, P.C.

(57) ABSTRACT

A nonvolatile memory device may include a memory cell array adapted to store tail-bit flag information indicating tail-bit memory cells, and a tail-bit controller adapted to calibrate a program start voltage of normal memory cells and a program start voltage of the tail-bit memory cells independently based upon the tail-bit flag information.

13 Claims, 9 Drawing Sheets

NONVOLATILE MEMORY DEVICE, PROGRAM METHOD THEREOF, AND MEMORY SYSTEM INCLUDING THE SAME

BACKGROUND

1. Field

Embodiments relate to a semiconductor memory device. More particularly, embodiments relate to a nonvolatile memory device calibrating a program start voltage and a programming method thereof.

2. Description of the Related Art

Semiconductor memory devices are devices that are able to store data and read data when it is necessary. Semiconductor memory devices are generally classified into Random Access Memory (RAM) devices and Read Only Memory (ROM) devices. RAM devices are volatile memory devices in which stored data may be lost when a power supply is turned off. ROM devices are nonvolatile memory devices in which stored data may be maintained, e.g., not lost, even when a power supply is turned off. RAM devices include Dynamic RAM (DRAM) devices, Static RAM (SRAM) devices, etc. ROM devices include Programmable ROM (PROM) devices, Erasable PROM (EPROM) devices, Electrically EPROM (EEPROM) devices, flash memory devices, etc. Flash memory devices are generally classified into NOR and NAND flash memory devices. An integration degree of a NAND flash memory device is higher than that of a NOR flash memory device.

A nonvolatile memory device such as the NAND flash memory device stores data using memory cell transistors. Each of the memory cell transistors may include a charge storage layer such as a floating gate or a charge trap layer. Charge may be accumulated or trapped in the charge storage layer when a program voltage having a predetermined level is applied to a control gate of the memory cell transistor. Accumulated or trapped charge may effectively change a threshold voltage of the memory cell transistor. As a result, the memory cell transistor may store data.

As a result of process variations, memory cell transistors may have different characteristics from each other. That is, e.g., some of the memory cell transistors may be programmed faster than others of the memory cell transistors. A memory cell transistor that is programmed faster than normal memory cell transistors is called a "tail-bit memory cell transistor". If the same program voltage is applied to memory cell transistors in a selected row, tail-bit memory cell transistors may be over-programmed to have higher threshold voltages than the normal memory cell transistors. Thus, tail-bit memory cell transistors may operate as off-cell transistors, which are always maintained at a turn-off state, and may cause read errors of the nonvolatile memory device.

SUMMARY

Embodiments are therefore directed to nonvolatile memory devices and programming methods thereof, which substantially overcome one or more of the problems due to the limitations and disadvantages of the related art.

It is therefore a feature of an embodiment to provide a nonvolatile memory device capable of reducing a programming operation time thereof.

At least one of the above and other features and advantages may be realized by providing a nonvolatile memory device including normal cells and at least one tail-bit cell, the nonvolatile memory device further including a memory cell array adapted to store tail-bit flag information regarding the tail-bit cell, and a tail-bit controller adapted to independently calibrate a first program start voltage of normal memory cells and a second program start voltage of the tail-bit memory cell in response to the tail-bit flag information.

The tail-bit controller may control the first program start voltage of the normal memory cells to be different from the second program start voltage of the tail-bit memory cell.

The first program start voltage of the normal memory cells may be higher than the second program start voltage of the tail-bit memory cell.

The first program start voltage may be a voltage adapted to set a threshold voltage of the corresponding normal memory cells to a voltage at or within a predetermined programmed voltage interval.

The tail-bit controller may set the program start voltage applied to a page including the normal memory cells and not the tail-bit cell to be higher than the program start voltage applied to a page including the tail-bit memory cell in response to the tail-bit flag information.

The memory cell array may include a plurality of memory blocks, each of which includes a separate storage region for storing the tail-bit flag information, the tail-bit flag information indicating locations of pages including each of the tail-bit memory cells in a corresponding memory block.

Each page of the memory cell array may include a storage region adapted to store the tail-bit flag information, the tail-bit flag information indicating whether the tail-bit memory cell exists in a corresponding page.

The storage region adapted to store the tail-bit flag information may be a storage region different from a storage region where user data is read or written.

At least one of the above and other features and advantages may be realized by providing a program method of a nonvolatile memory device, including reading tail-bit flag information corresponding to at least one tail-bit memory cell of a memory cell array, calibrating, based on the tail-bit flag information, a program start voltage to be applied to a page including the tail-bit memory cell and a program start voltage to be applied to a page including normal memory cells and not including the tail-bit memory cell, and executing a programming operation depending on the calibrated program start voltage.

Calibrating may include setting the program start voltage to be applied to the page including the tail-bit memory cell to be different from the program start voltage to be applied to the page including the normal memory cells and not including the tail-bit memory cell.

Calibrating may include setting the program start voltage to be applied to the page not including the tail-bit memory cell to be higher that the program start voltage to be applied to the page including the tail-bit memory cell.

Executing may include calibrating a number of program pulses to be applied respectively to the page including the normal memory cells and not the tail-bit memory cell and the page including the tail-bit memory cell.

The number of program pulses applied to the page including the normal memory cells and not the tail-bit cell may be fewer than the number of program pulses applied to the page including the tail-bit memory cell.

A memory system may include a nonvolatile memory device, and a memory controller adapted to control the nonvolatile memory device, wherein the nonvolatile memory device includes a nonvolatile memory device including one or more features described herein.

A memory card may include a nonvolatile memory device, and a memory controller adapted to control the nonvolatile memory device, wherein the nonvolatile memory device includes a nonvolatile memory device including one or more features described herein.

At least one of the above and other features and advantages may be realized by providing a tail-bit controller for use with a nonvolatile memory device including at least one tail-bit cell, the tail-bit controller including a tail-bit determiner for determining whether a tail-bit cell exists in a page to be programmed, and a program voltage controller for controlling, based on a determination of the tail-bit determiner, a first program voltage for a page not including a tail-bit cell to be higher than a second program voltage for a page including a tail-bit cell.

The tail-bit determiner may determine whether a tail-bit flag is set high or low.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF EXEMPLARY EMBODIMENTS

Korean Patent Application No. 10-2008-0004957, filed on Jan. 16, 2008, in the Korean Intellectual Property Office, and entitled: "Nonvolatile Memory Device, Program Method Thereof, and Memory System Including the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey aspects of the invention to those skilled in the art. More particularly, in the following description, while aspects may be described in relation to a flash memory device, as an exemplary embodiment, embodiments are not limited thereto. For example, aspects may be applied to various nonvolatile memory devices such as PRAM, RRAM, MRAM, FRAM, etc.

Embodiments may provide a nonvolatile memory device adapted to calibrate a program start voltage in response to tail-bit flag information. A program start voltage of a page including normal memory cells, without any tail-bit memory cells, may be set higher than a program start voltage of a page including at least one tail-bit memory cell and normal memory cells.

Embodiments may separately provide a nonvolatile memory device in which an operating error may be reduced and/or prevented.

Embodiments may separately provide a nonvolatile memory device in which a programming operation time may be reduced.

Figure 1:
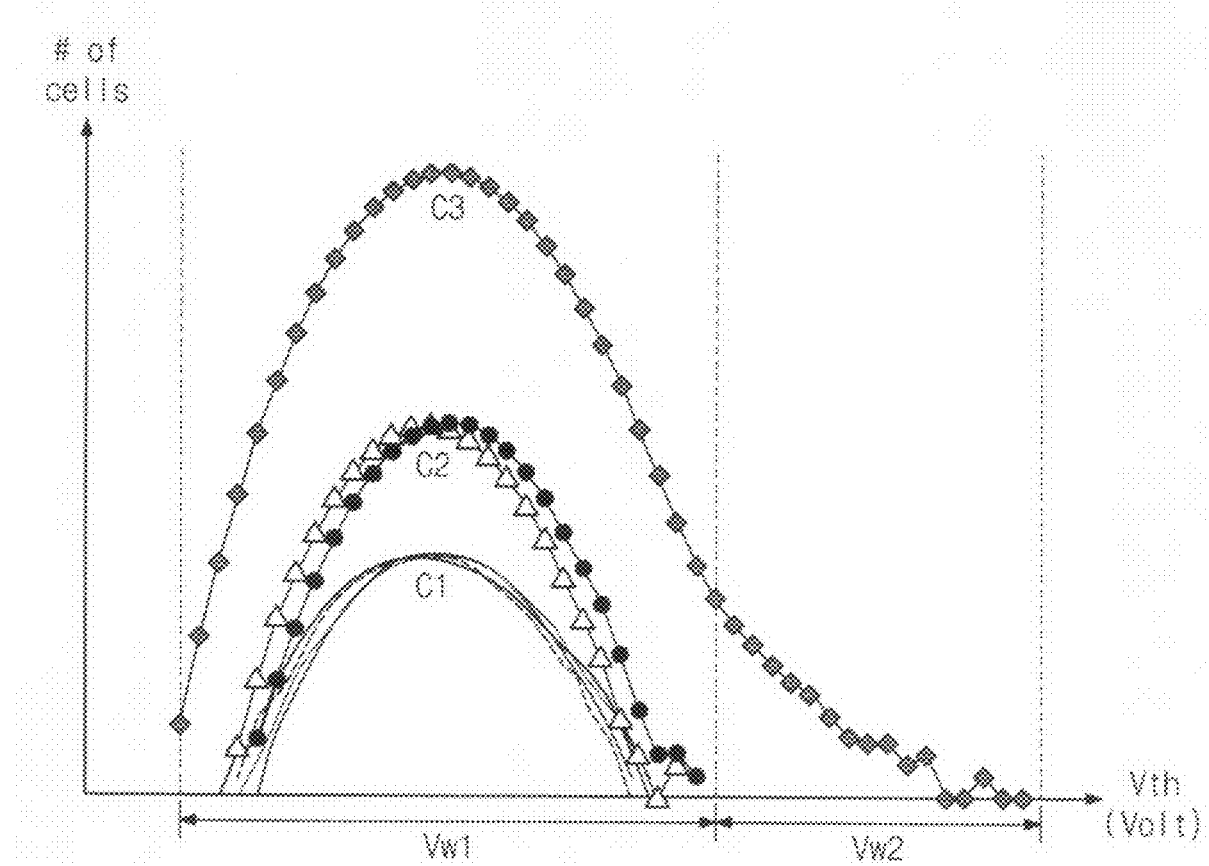
FIG. 1 illustrates a diagram of distributions of threshold voltages of exemplary nonvolatile memory cells.

FIG. 1 illustrates a diagram of distributions of threshold voltages of exemplary nonvolatile memory cells. In FIG. 1, a horizontal axis represents threshold voltages of the nonvolatile memory cells, and a vertical axis represents the number of flash memory cells.

More particularly, FIG. 1 illustrates a plurality of first curves C1, a plurality of second curves C2 and a third curve C3. Each of the plurality of first curves C1 represents a distribution of threshold voltages of flash memory cells in a respective page. Each of the plurality of second curves C2 represents a distribution of threshold voltages of flash memory cells in a respective memory block. The third curve C3 represents a distribution of threshold voltages of flash memory cells in a memory chip.

Referring to FIG. 1, the first curves C1 may exist within a first voltage interval Vw1.

A memory block generally includes a plurality of pages. Thus, threshold voltages of memory cells in a memory block may be distributed within a same voltage interval as the threshold voltages of memory cells in respective pages. For example, referring to FIG. 1, the second curves C2 may exist within the first voltage interval Vw1 corresponding to the first curves C1.

A memory chip generally includes a plurality of memory blocks. Thus, threshold voltages of memory cells in a memory chip may be distributed in a same voltage interval as the threshold voltages of memory cells in the memory blocks. However, referring to the third curve C3, in the case of the exemplary memory chip, the threshold voltages of memory cells therein are distributed in the first voltage interval Vw1 and a second voltage interval Vw2, where the second voltage interval Vw2 is higher than the first voltage interval Vw1. Such a distribution may result from tail-bit memory cells that may be programmed relatively faster than normal memory cells.

In general, one tail-bit memory cell may occur in a memory block. Thus, tail-bit memory cells may not appear in the first and second curves C1 and C2 representing the general distributions of threshold voltages of memory cells in pages and memory blocks, respectively.

More particularly, due to process variations, a flash memory device may include tail-bit memory cells that may be programmed faster than normal memory cells. Referring to the third curve C3, when a program voltage is applied to memory cells in a selected row, memory cells having threshold voltages in the second voltage interval Vw2 may be programmed to have higher threshold voltages than memory cells having threshold voltages in the first voltage interval Vw1. That is, the memory cells having threshold voltages in the second voltage interval Vw2 may be programmed faster than the memory cells having threshold voltages in the first voltage interval Vw1. Like memory cells having threshold voltages in the second voltage interval Vw2, tail-bit memory cells may be memory cells that are programmed faster than the normal memory cells having threshold voltages in the first voltage interval Vw1.

Exemplary tail-bit memory cells are disclosed in Korean Patent Publication No. 2005-0015889 entitled "Method for fabricating nonvolatile memory device with improved threshold voltage uniformity," which is incorporated by reference herein in its entirety.

Figure 2:
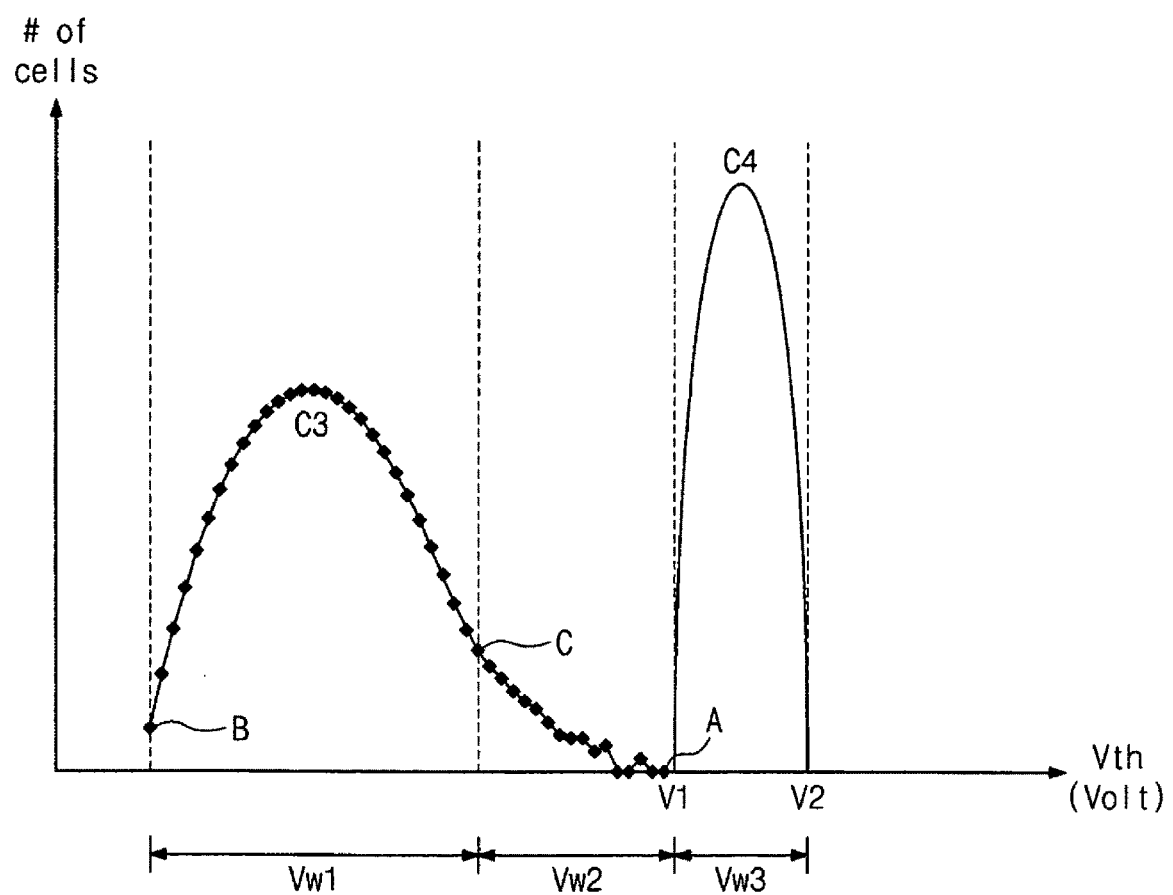
FIG. 2 illustrates a diagram for describing an exemplary method of programming tail-bit memory cells.

FIG. 2 illustrates a diagram for describing an exemplary method of programming tail-bit memory cells. More particularly, FIG. 2 illustrates the third curve C3 of FIG. 1 and a fourth curve C4. Referring to FIG. 2, a horizontal axis represents a distribution of threshold voltages of flash memory cells. A vertical axis represents the number of the flash memory cells. As discussed above with regard to FIG. 1, the third curve C3 represents the distribution of threshold voltages of memory cells in an exemplary memory chip. The fourth curve C4 represents a distribution of threshold voltages of programmed memory cells. Referring to the fourth curve C4, in the exemplary embodiment, the threshold voltages of the programmed memory cells are distributed in a third voltage interval Vw3 between a first voltage V1 and a second voltage V2.

A program start voltage may be determined based upon features of memory cells that may be programmed faster than the normal memory cells, e.g., based on the respective threshold voltage of the memory cell that may be programmed faster. In FIG. 2, the memory cells that may be programmed faster than the normal memory cells are memory cells A having threshold voltages in the second voltage interval Vw2. In this case, the memory cells A are defined as tail-bit memory cells. The program start voltage may be set such that the tail-bit memory cells A are programmed to have a threshold voltage lower than or equal to the first voltage V1 when the program start voltage is applied. For example, the program start voltage may be set so that the threshold voltages of the tail-bit memory cells A reach the first voltage V1, i.e., the tail-bit memory cells A have threshold voltages equal to V1. Then, a programming operation may be executed with a program voltage being increased stepwise.

In embodiments, a number of program pulses applied to the memory cells may determined according to memory cells that are programmed relatively slowly, e.g., the normal memory cells. In FIG. 2, the memory cells being programmed slowly are memory cells B in the first voltage interval Vw1. A stepwise increasing program pulse may be repetitively applied to the respective memory cells until threshold voltages of the memory cells B are distributed within the third voltage interval Vw3. That is, the program pulse may be applied repetitively until threshold voltages of all memory cells in the memory chip are distributed within the third voltage interval Vw3.

More particularly, in embodiments, e.g., a number of program pulses applied to memory cells to complete a programming operation may be defined by the number of program pulses=1+Vw1/$\Delta$V+Vw2/$\Delta$V. Herein, $\Delta$V represents a voltage difference between an nth program pulse and a (n−1)th program pulse.

In accordance with the above-described equation, a number of program pulses applied to memory cells may be identical to a sum of the number of program pulses for a program start voltage (e.g., 1), the number of program pulses used to enable threshold voltages of the tail-bit memory cells A to reach the third voltage interval Vw3 (e.g., Vw2/$\Delta$V), and the number of program pulses used to enable threshold voltages of the memory cells B to reach the third voltage interval Vw3 (e.g., Vw1/$\Delta$V).

Figure 3:
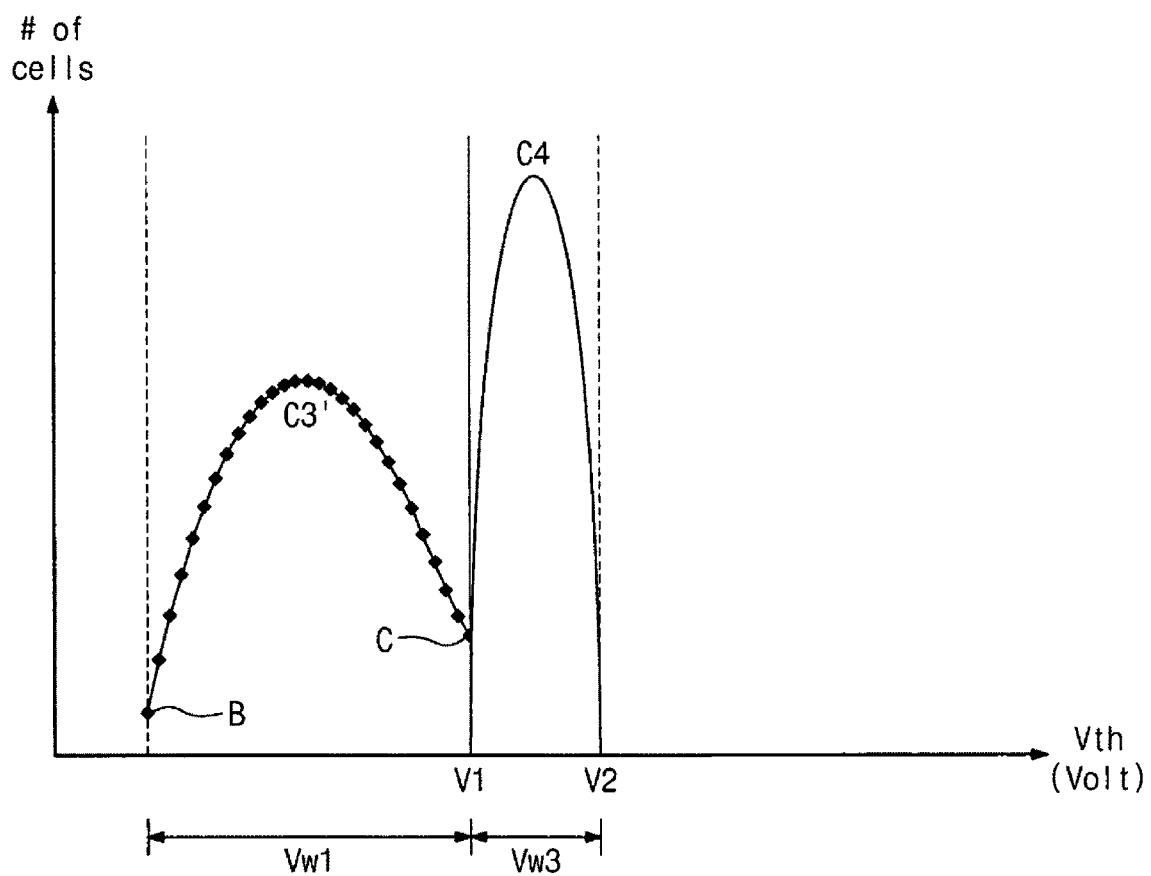
FIG. 3 illustrates a diagram for describing an exemplary method of programming normal memory cells.

FIG. 3 illustrates a diagram for describing an exemplary method of programming normal memory cells. A horizontal and a vertical axis of FIG. 3 is the same as that of FIG. 2. Referring to FIG. 3, a curve C3' represents a distribution of threshold voltages identical to the curve C3, but excluding the threshold voltages of the tail-bit memory cells A.

Memory cells C are memory cells, which may be programmed relatively faster, among the normal memory cells having threshold voltages in the first voltage interval Vw1. If the tail bit memory cells are not considered, the program start voltage may be set so that threshold voltages of the memory cells C are distributed to be lower than the first voltage V1. For example, the program start voltage may be set such that threshold voltage of the memory cells C become equal to the first voltage V1. In these cases, the number of program pulses applied to the normal memory cells to complete a programming operation may be defined as the number of program pulses=1+Vw1/$\Delta$V.

In this case, the number of program pulses may equal a sum of the number of program pulses for a level of the program start voltage (e.g., 1) and the number of program pulses used to enable threshold voltages of the memory cells B to reach the third voltage interval Vw3 (e.g., Vw1/$\Delta$V).

In accordance with the above-described equations, Vw2/$\Delta$V program pulses may be additionally required due to the tail-bit memory cells. As discussed above, on average, there generally exists one tail-bit cell per memory block. That is, it is inefficient to apply Vw2/$\Delta$V additional program pulses for a statistically ignorable number of tail-bit cells. Embodiments may enable a number of program pulses required for completing a programming operation to be decreased by calibrating a program start voltage according to whether tail-bit memory cells exist in a page of the memory block to be programmed.

Figure 4:
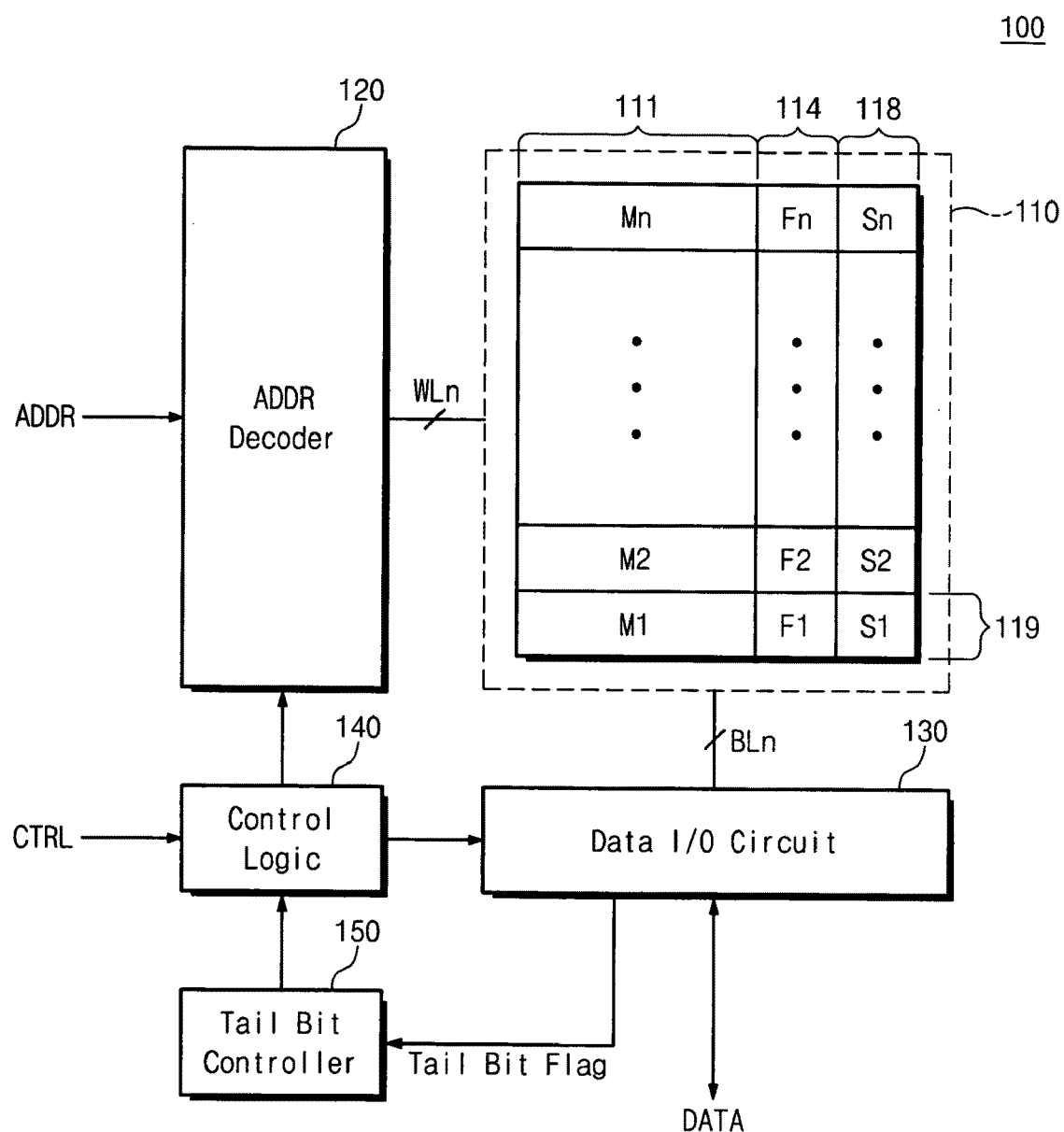
FIG. 4 illustrates a block diagram of a nonvolatile memory device according to an exemplary embodiment.

FIG. 4 illustrates a block diagram of a nonvolatile memory device according to an exemplary embodiment. For a concise description, the nonvolatile memory device is assumed to be a NAND flash memory device. However, it should be understood to those skilled in the art that the exemplary nonvolatile memory device is not limited to being a NAND flash memory device.

Referring to FIG. 4, the exemplary NAND flash memory 100 may include a memory cell array 110, an address decoder 120, a data input/output (I/O) circuit 130, control logic 140, and a tail-bit controller 150.

The memory cell array 110 may be connected with the address decoder 120 via word lines WLn and may be connected with the data I/O circuit 130 via bit lines BLn. Data of the memory cell array 110 selected by the address decoder 120 may be transmitted to the data I/O circuit 130.

The memory cell array 110 may include a plurality of memory blocks. For a concise description, a memory block is shown in the memory cell array 110. The memory block includes a plurality of pages 119. Referring to FIG. 4, each page may include a main field 111, a flag field 114 and a spare field 118. The main filed 111 may be a region in which user data may be written or read. The flag field 114 may be a region where flag information for writing or reading operations of the memory cell array 110 may be stored. For example, the flag field 114 may include flag signals for multi-level programming. The spare field 115 may be a region to store block status information or an error correction code ECC.

The memory cell array 110 of the flash memory device 100 may include a storage region for storing tail-bit flag information. The tail-bit flag information may be information indicating, e.g., the presence, absence and/or location of tail-bit memory cells in the memory cell array 110. More particularly, e.g., the tail-bit flag information may indicate locations of pages including the tail-bit memory cells among a plurality of pages in a predetermined memory block. For example, the tail-bit flag information may include addresses of the pages including the tail-bit memory cells. In this case, the tail-bit flag information may be stored in the corresponding memory block.

In other embodiments, e.g., the tail-bit flag information may indicate whether a predetermined page 119 includes the tail-bit memory cells. In this case, the tail-bit flag information may be stored in the corresponding page 119. The tail-bit flag information may be stored in storage regions except for the main field 111 of the page 119. For example, the tail-bit flag information may be stored in a flag field 114 or a spare field 118.

The address decoder 120 may be connected with the memory cell array 110 and the control logic 140. The address decoder 120 may receive an address ADDR from an exterior and selects rows and columns of the memory cell array 110 in response to a control of the control logic 140. The address decoder 120 may include well-known devices, e.g., a row decoder and a column selector.

The data input/output circuit 130 may be connected with the memory cell array 110, the control logic 140 and the tail-bit controller 150. The data input/output circuit 130 may execute a reading or writing operation of the memory cell array 110 in response to a control of the control logic 140. If the tail-bit flag information is read from the memory cell array 110, the input/output circuit 130 may transmit the tail-bit flag information to the tail-bit controller 150. The input/output circuit 130 may communicate with an external device to transfer and receive data thereto and therefrom.

The control logic 140 may be connected with the address decoder 120, the data input/output circuit 130 and the tail-bit controller 150. The control logic 140 may control general operations of the flash memory device 100 in response to, e.g., an externally supplied control signal CTRL. When data is written to the memory cell array 110, the control logic 140 may control the address decoder 120 and the data input/output circuit 130 to read the tail-bit flag information of a page to be programmed. The control logic 140 may execute a programming operation in response to a control of the tail-bit controller 150.

The tail-bit controller 150 may be connected with the data input/output circuit 130 and the control logic 140. The tail-bit controller 150 may receive the tail-bit flag information from the data input/output circuit 130. The tail-bit controller 150 may calibrate the program start voltage in response to the tail-bit flag information. For example, the tail-bit controller 150 may determine the program start voltage of a page including the normal cells and no tail-bit cells to be higher than that of a page including a tail-bit memory cell. The program start voltage determined by the tail-bit controller 150 may be transmitted to the control logic 140.

Figure 5:
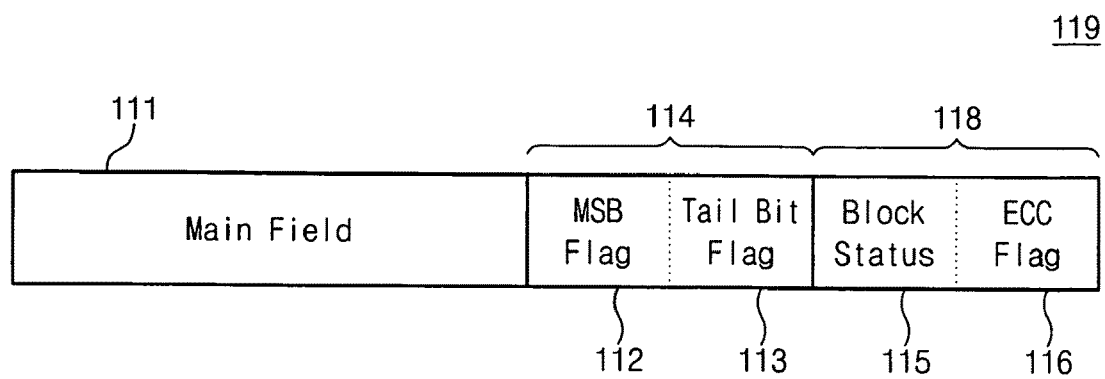
FIG. 5 illustrates a block diagram of a structure of an exemplary page of the memory cell shown in FIG. 4.

FIG. 5 illustrates a block diagram of a structure of an exemplary page 119 of the memory cell shown in FIG. 4. Referring to FIG. 4 and FIG. 5, the page 119 of the NAND flash memory device 100 may include the main field 111, the flag field 114 and the spare field 118. The main field 111 may be a region where user data may be read or written. The flag field 114 may be a region used to store flag information for reading or writing operations of the NAND flash memory 100.

The flag field 114 may store Most Significant Bit (MSB) flag information 112 and the tail-bit flag information 113. The MSB flag information 112 may be used if memory cells of the memory cell array 110 are programmed as multi-level cells. The MSB flag information 112 may represent whether memory cells of a corresponding page are programmed with MSB data. The tail-bit flag information 113 may represent whether a corresponding page includes a tail-bit memory cell. In some embodiments, e.g., the tail-bit flag information 113 may indicate each page of a corresponding memory block that includes a tail-bit memory cell. In this case, the tail-bit flag information 113 may be stored in one of a plurality of pages of the corresponding memory block.

The spare field 118 may be a region for storing error correction code information or a state of a corresponding memory block. The spare field 118 may store block state information representing whether a corresponding memory block is defected. The spare field 118 may store the error correction code information of data stored in the main field 111.

Figure 6:
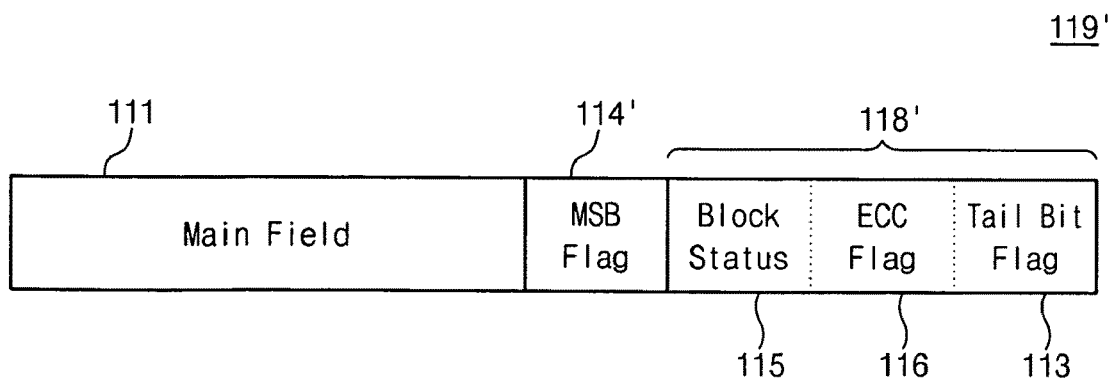
FIG. 6 illustrates a block diagram of a structure of another exemplary page of the memory cell shown FIG. 4.

FIG. 6 illustrates a block diagram of a structure of another exemplary page 119' of the memory cell shown FIG. 4. In FIG. 6, constituent components which are identical to those in FIG. 5 are marked by the same reference numerals. Referring to FIG. 6, the page 119' may include the main field 111, a flag field 114' and a spare field 118'. Referring to FIG. 6, the tail-bit flag information 113 may be stored in the spare field 118'.

More particularly, referring to FIG. 5 and FIG. 6, in embodiments, e.g., the tail-bit flag information 113 may be stored in the flag field 114 or the spare field 118'. However, it may be understood to those skilled in the art that storing of the tail-bit flag information is not limited to this disclosure. For example, it is possible to store the tail-bit flag information in any region except for the main field 111.

Figure 7:
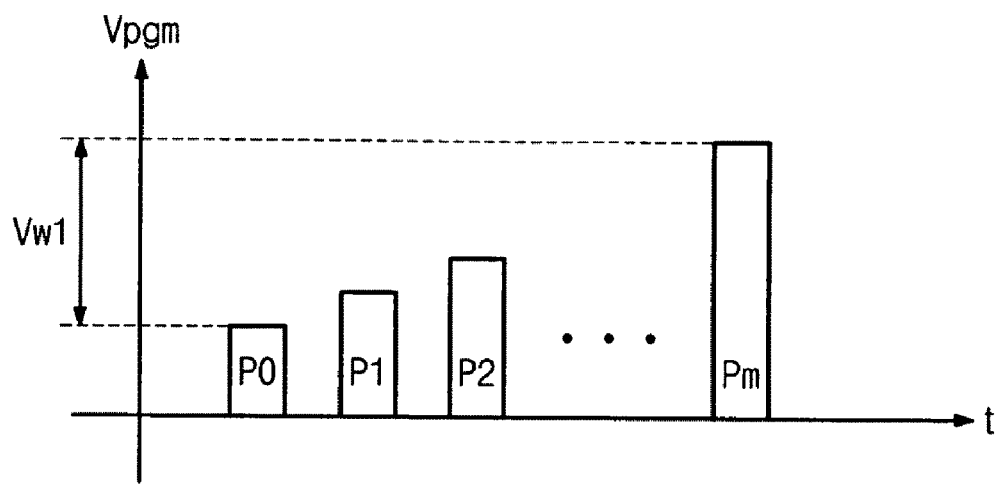
FIG. 7 and FIG. 8 illustrate graphs for describing an operation of the flash memory device of FIG. 4.
Figure 8:
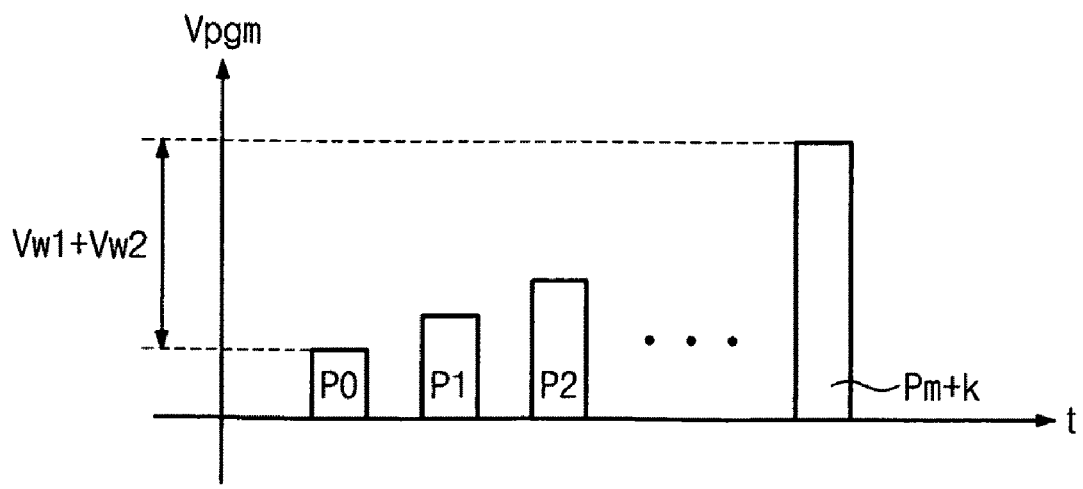

FIG. 7 and FIG. 8 illustrate graphs for describing an operation of the flash memory device of FIG. 4. In FIGS. 7 and 8, a horizontal axis represents time and a vertical axis represents a program voltage applied to memory cells.

Referring to FIGS. 3, 4 and 7, the tail-bit controller 150 may calibrate the program start voltage in response to the tail-bit flag information read from the memory cell array 110. If a page to be programmed includes normal cells and no tail-bit cells, e.g. if the tail-bit flag information of the corresponding page is logically low, the tail-bit controller 150 may calibrate the program start voltage so that threshold voltages of the memory cells C in the first voltage interval Vw1 may be distributed to be lower than the first voltage V1. For example, the program start voltage may be calibrated so that threshold voltages of the memory cells C may reach a voltage level equal to the first voltage V1. Then, memory cells of a corresponding page may be supplied with a program pulse P0 having a voltage level of the program start voltage set by the tail-bit controller 150.

Then, a programming operation may be executed with an incrementally increasing program voltage Vpgm. The programming operation may be repeated until threshold voltages of the memory cells B in the first voltage interval Vw1 reaches the third voltage interval Vw3. In accordance with the above-described equation, a number of program pulses applied to memory cells is $=(1+Vw1/\Delta V)$, if a voltage increment of the program voltage Vpgm is $\Delta V$. For example, if $Vw1/\Delta V$ is m (m is a positive integer), the number of program pulses applied to memory cells is $=(1+m)$.

Referring to FIGS. 2, 4 and 8, in cases including a tail bit, the tail-bit controller 150 may calibrate a program start voltage in response to the tail-bit flag information read from the memory cell array 110. If a corresponding page includes the tail-bit cell, e.g. if the tail-bit flag information is logically high, the tail-bit controller 150 may set the program start voltage so that threshold voltages of the memory cells A in the second voltage interval Vw2 are distributed to be lower than the first voltage V1. In an example, the program start voltage may be calibrated so that threshold voltages of the memory cells A reach the same voltage level with the first voltage V1. Then, a program pulse P0 having a voltage level of the program start voltage may be applied to corresponding memory cells.

Then, a programming operation may be executed with an incrementally increasing program voltage Vpgm. The programming operation may be repeated until threshold voltages of the memory cells B in the first voltage interval Vw1 reach the third voltage interval Vw3. In accordance with the above-described equation, a number of program pulses applied to memory cells is=(1+Vw2/$\Delta$V+Vw1/$\Delta$V). For example, if Vw2/$\Delta$V is k (k is a positive integer), the number of program pulses applied to memory cells is=(1+m+k).

In summary, during a programming operation, the tail-bit controller 150 may differentiate a program start voltage to be applied to a page including normal cells and no tail-bit cells and a program start voltage to be applied to a page including a tail-bit memory cell, based upon the tail-bit flag information. The program start voltage of the page including normal cells and no tail-bit cells may be set to be higher than that of a page including the tail-bit memory cell. In such cases, e.g., (1+m) program pulses may be applied to a page including the normal cells and no tail-bit cells, and (1+m+k) program pulses may be applied to a page including the tail-bit cell. Thus, operational errors due to the tail-bit memory cell may be reduced and/or prevented. Further, a programming operation time may be reduced compared with a conventional programming operation where (1+m+k) program pulses are applied to all pages.

Figure 9:
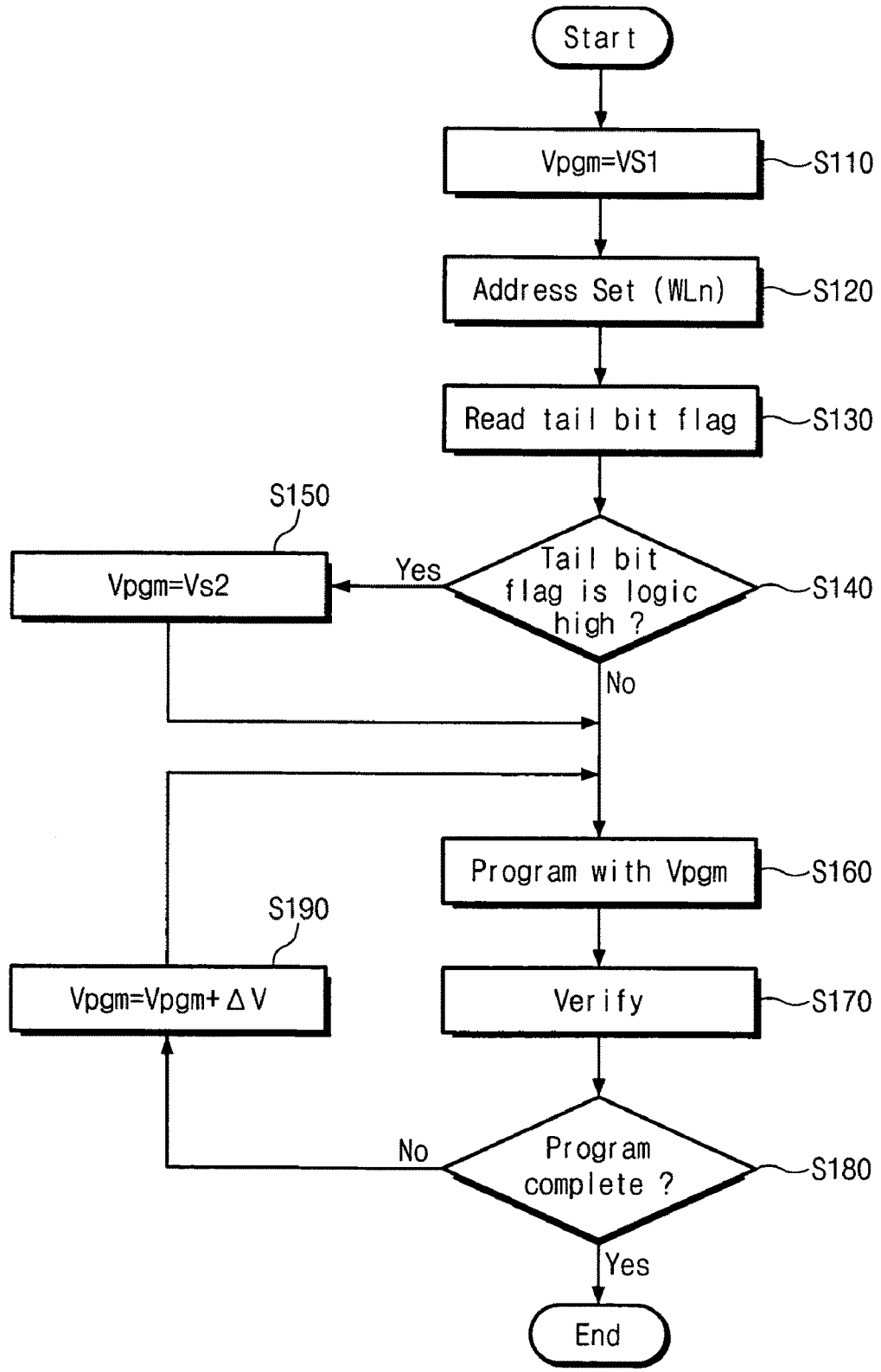
FIG. 9 illustrates a flowchart of an exemplary programming operation of the flash memory device shown in FIG. 4.

FIG. 9 illustrates a flowchart of an exemplary programming operation of the flash memory device shown in FIG. 4. Referring to FIGS. 4 and 9, at S110, a program voltage Vpgm may be set to a first program start voltage VS1. The first program start voltage VS1 may be a program start voltage that is applied to a page including normal cells and no tail-bit cells. It is possible to skip S110 if the first program start voltage VS1 is set to a default program start voltage in the flash memory device 100 of FIG. 4.

In S120, an address ADDR selecting a predetermined word line WLn may be transmitted from an external device. If the address ADDR is transmitted, in S130, the tail-bit flag information of a page corresponding to the transmitted address ADDR may read under the control of the control logic 140. If the tail-bit flag information is stored in a memory block unit, the tail-bit flag information of a corresponding page may be read from a storage region block storing the tail-bit flag information of a corresponding memory block. If the tail-bit flag information is stored in a page unit, the tail-bit flag information may be read from a storage region of a corresponding page.

In S140, the tail bit controller 150 may determine whether the tail-bit flag information is logically high or low. If the tail-bit flag information is determined to be logically high, that is, e.g., if the corresponding page includes the tail-bit cell, the procedure goes to S150, in which the program voltage Vpgm may be set to the second program start voltage VS2. The second program start voltage VS2 may be a program start voltage to be applied to a page including the respective tail-bit cell. That is, the second program start voltage VS2 may be lower than the first program start voltage VS1. The process may proceed to S160.

On the other hand, if the tail-bit flag information is determined to be logically low, that is, e.g., if the corresponding page includes normal cells and no tail-bit cells, the procedure may go to S160, in which a program pulse P0 having a voltage level corresponding to the first or second program start voltage VS1 and VS2 may be applied to memory cells of a corresponding page.

Next, in S170, a verify operation may be executed to read out data from programmed memory cells. In S180, it may be checked whether a programming operation is completed, based upon the read data. If all memory cells are checked to be programmed, the procedure may end. If at least one of memory cells is checked not to be programmed, the procedure may proceed to S190, in which the program voltage Vpgm may be increased with the voltage increment $\Delta$V.

S160 to S190 may be repeated until memory cells are completely programmed. As shown in FIGS. 7 and 8, (1+m) program pulses may be applied to a page including normal cells and no tail-bit cells, and (1+m+k) program pulses may be applied to a page including a tail-bit cell.

The above embodiments are described under the assumption that the first program start voltage VS1 is a program start voltage of a page including normal cells and no bit-line cells. However, it is possible to use the first program start voltage VS1 as a program start voltage that is applied to a page including the tail-bit cells. In this case, the second program start voltage VS2 may be a program start voltage that is applied to a page composed with the normal cells. And the first program start voltage VS1 may be lower than the second program start voltage VS2.

Further, the above embodiments are described under the assumption that if the tail-bit flag information is logically high, a corresponding page includes the tail-bit cell. However, it may be understood to those skilled in the art that if the tail-bit flag information is logically high a corresponding page may be a page including normal cells and no tail-bit cell.

Figure 10:
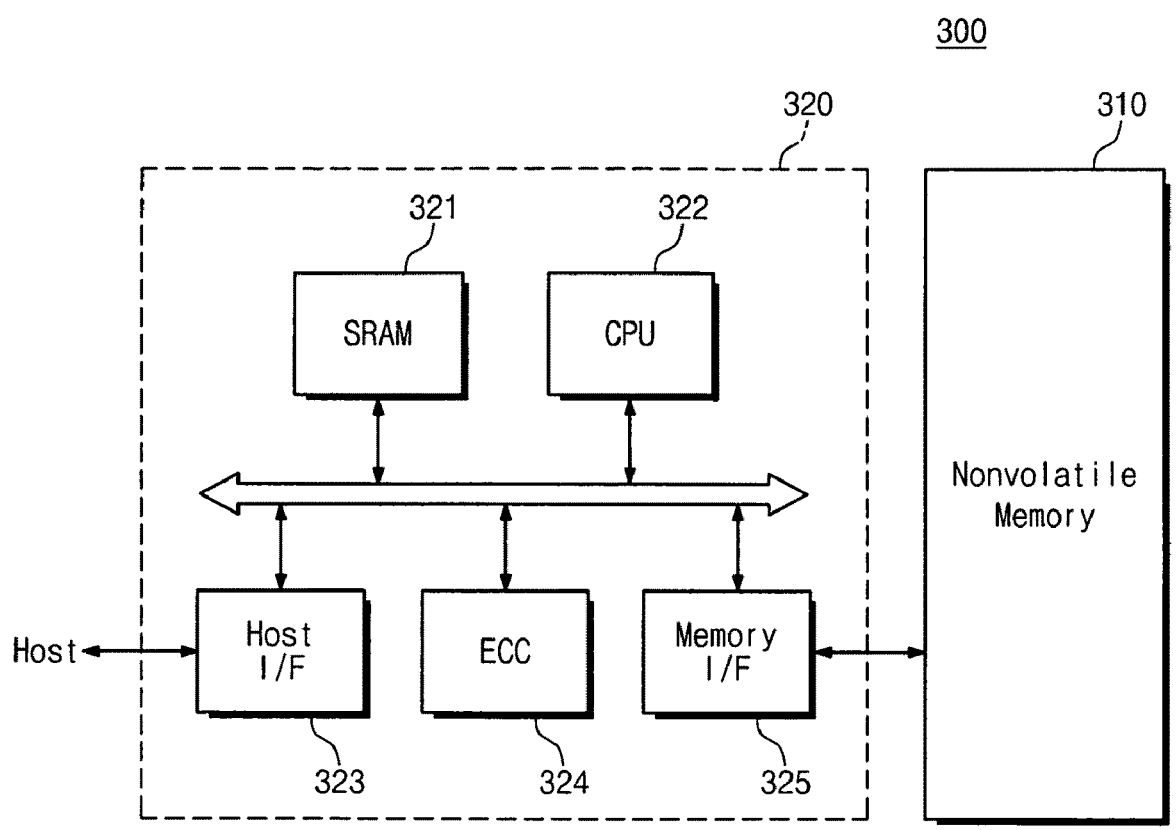
FIG. 10 illustrates a block diagram of an exemplary memory system including a flash memory device according to an exemplary embodiment.

FIG. 10 illustrates a block diagram of an exemplary memory system 300 including a flash memory device 310 according to an exemplary embodiment. Referring to FIG. 10, the memory system 300 may include the flash memory device 310 and a memory controller 320. The memory controller 320 may include SRAM 321, a processing unit 322 such as CPU, a host interface 323, an error correction block 324, and a memory interface 325.

The SRAM 321 may be used as an operational memory of the processing unit 322. The processing unit 322 may control general operations of the memory controller 320. The host interface 323 may include a protocol for exchanging data between a host and the memory controller 320. In an example, the memory controller 320 may communicate with the host using one of various interface protocols such as USB, MMC, PCI-E, ATA, Serial-ATA, Parallel-ATA, SCSI, ESDI, IDE, etc. The error correction block 324 may detect and correct an error of data read from the flash memory device 310. The memory interface 325 may interface with the flash memory device 310. Components of the memory controller 320 may be well-known to those skilled in the art, description thereof is thus skipped for a concise description.

It may be understood that the flash memory device 310 and the memory controller 320 may be integrated into a card or a semiconductor device. Moreover, the memory system 300 may be formed as a Solid State Disk/Drive using nonvolatile memory devices for storing data.

Figure 11:
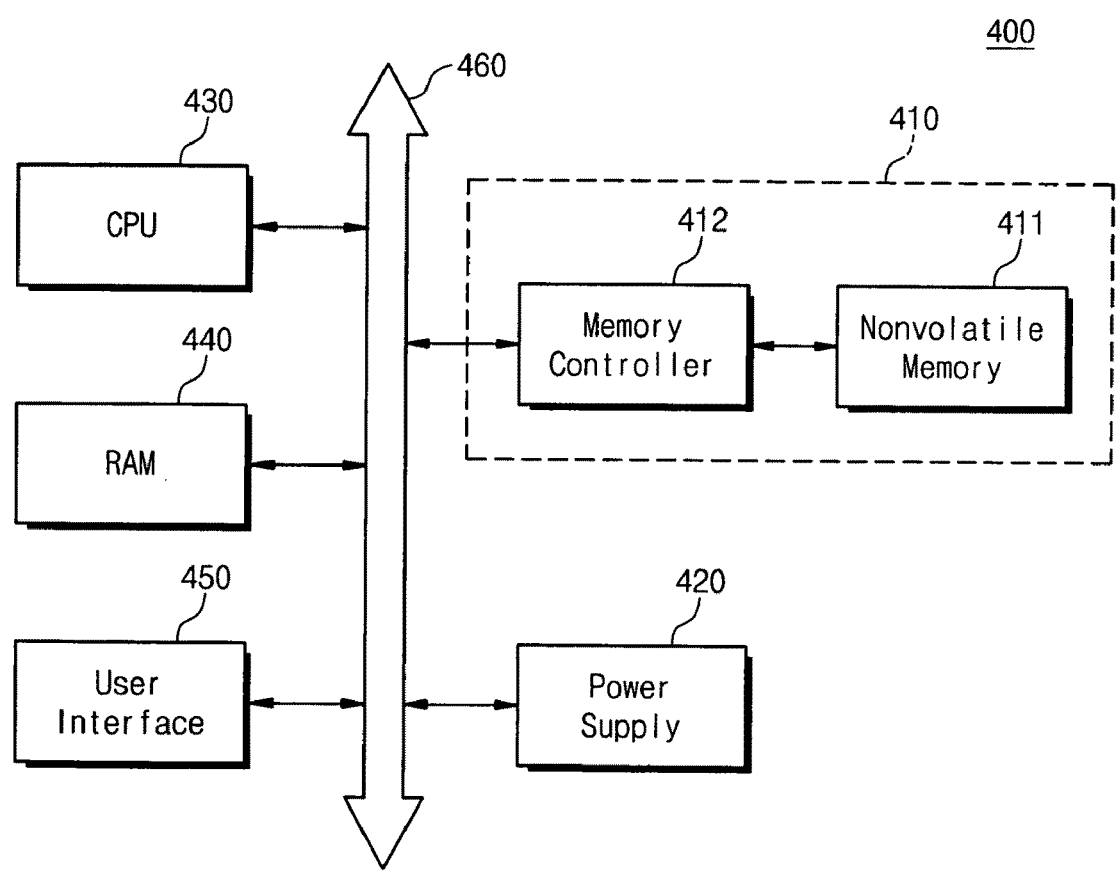
FIG. 11 illustrates a block diagram of an exemplary computing system including a memory system according to an exemplary embodiment.

FIG. 11 illustrates a block diagram of an exemplary computing system 400 including a memory system as shown in FIG. 10. Referring to FIG. 11, the computing system 400 may include the memory system 410, a power supply 420, a central processing unit 430, RAM 440, a user interface 450 and a system bus 460.

The memory system 410 may be electrically connected with the power supply 420, the central processing unit 430, the RAM 440 and the user interface 450 via the system bus 460. Data provided via the user interface 450 or processed by the central processing unit 430 may be stored in the memory system 410.

If the flash memory 411 operates as the Solid State Disk/Drive, an operation speed of the computing system 400 may greatly increase. Although not explicitly shown, it may be understood to those skilled in the art that the computing system 400 according to embodiments may further include, e.g., an application chipset, a camera image processor, etc.

Exemplary embodiments are described with an example of a flash memory. However, embodiments are not limited to a flash memory. For example, the technical scope of one or more aspects of the present invention may be applied to various nonvolatile memory devices such as PRAM, MRAM, RRAM, FRAM, etc.

Further, in the above description, it is described that the tail-bit flag information may be stored in the flag field or the spare field. However, a storage region storing the tail-bit flag information is not limited to the flag field or the spare field. The tail-bit flag information may be stored in a storage region except for the main field where user data is read or written.

As described above, a nonvolatile memory device according an embodiment may calibrate a program start voltage depending on whether a page to be programmed includes a tail-bit cell. In embodiments, an error-rate of a nonvolatile memory device resulting from tail-bit cells may be reduced and/or eliminated. In embodiments, a programming operation time may be reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile memory device including normal memory cells and at least one tail-bit memory cell, the nonvolatile memory device further comprising:
a memory cell array adapted to store tail-bit flag information regarding the tail-bit memory cell; and
a tail-bit controller adapted to independently calibrate a first program start voltage of the normal memory cells and a second program start voltage of the tail-bit memory cell in response to the tail-bit flag information,
wherein the first program start voltage of the normal memory cells is higher than the second program start voltage of the tail-bit memory cell.

2. The nonvolatile memory device as claimed in claim 1, wherein the first program start voltage is a voltage adapted to set a threshold voltage of the corresponding normal memory cells to a voltage at or within a predetermined programmed voltage interval.

3. The nonvolatile memory device as claimed in claim 1, wherein the tail-bit controller is adapted to set the first program start voltage applied to a page including the normal memory cells and not the tail-bit cell to be higher than the second program start voltage applied to a page including the tail-bit memory cell in response to the tail-bit flag information.

4. The nonvolatile memory device as claimed in claim 3, wherein the memory cell array includes a plurality of memory blocks, each of which includes a separate storage region adapted to store the tail-bit flag information, and
the tail-bit flag information indicates locations of pages including each of tail-bit memory cells in a corresponding memory block.

5. The nonvolatile memory device as claimed in claim 3, wherein each page of the memory cell array includes a storage region adapted to store the tail-bit flag information, and
the tail-bit flag information indicates whether the tail-bit memory cell exists in a corresponding page.

6. The nonvolatile memory device as claimed in claim 5, wherein the storage region adapted to store the tail-bit flag information is a storage region different from a storage region where user data is read or written.

7. A program method of a nonvolatile memory device, comprising:
reading tail-bit flag information corresponding to at least one tail-bit memory cell of a memory cell array;
calibrating, based on the tail-bit flag information, a program start voltage to be applied to a page including the tail-bit memory cell and a program start voltage to be applied to a page including normal memory cells and not including the tail-bit memory cell,
wherein calibrating includes setting the program start voltage to be applied to the page not including the tail-bit memory cell to be higher than the program start voltage to be applied to the page including the tail-bit memory cell; and
executing a programming operation depending on the calibrated program start voltages.

8. The program method as claimed in claim 7, wherein executing includes calibrating a number of program pulses to be applied respectively to the page including the normal memory cells and not the tail-bit memory cell and the page including the tail-bit memory cell.

9. The program method as claimed in claim 8, wherein the number of program pulses applied to the page including the normal memory cells and not the tail-bit cell is fewer than the number of program pulses applied to the page including the tail-bit memory cell.

10. A memory system, comprising:
a nonvolatile memory device; and
a memory controller adapted to control the nonvolatile memory device,
wherein the nonvolatile memory device includes a nonvolatile memory device as claimed in claim 1.

11. A memory card, comprising:
a nonvolatile memory device; and
a memory controller adapted to control the nonvolatile memory device,
wherein the nonvolatile memory device includes a nonvolatile memory device as claimed in claim 1.

12. A tail-bit controller for use with a nonvolatile memory device including at least one tail-bit cell, the tail-bit controller comprising:
tail-bit determining means for determining whether a tail-bit cell exists in a page to be programmed; and
program voltage controlling means for controlling, based on a determination of the tail-bit determining means, a first program voltage for a page not including a tail-bit cell to be higher than a second program voltage for a page including a tail-bit cell.

13. The tail-bit controller as claimed in claim 12, wherein the tail-bit determining means determines whether a tail-bit flag is set high or low.

* * * * *